United States Patent
Lee et al.

(10) Patent No.: US 8,232,575 B2
(45) Date of Patent: Jul. 31, 2012

(54) ORGANIC LIGHT EMITTING DIODE DISPLAY AND METHOD FOR MANUFACTURING THE SAME

(75) Inventors: Kyung-Jun Lee, Yongin (KR); Sung-Jin Bae, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 111 days.

(21) Appl. No.: 12/833,666

(22) Filed: Jul. 9, 2010

(65) Prior Publication Data

US 2011/0006336 A1 Jan. 13, 2011

(30) Foreign Application Priority Data

Jul. 10, 2009 (KR) .................. 10-2009-0063230

(51) Int. Cl.
*H01L 33/52* (2010.01)
*H01L 21/56* (2006.01)

(52) U.S. Cl. ...................................................... 257/99
(58) Field of Classification Search ............. 257/99, 257/40, 642–643, 759, E21.503, E51.001–51.052, 257/E25.008–E25.009, 252–254, 257–258; 438/29, 69, 82, 99, 28, 22, 24, 48
See application file for complete search history.

(56) References Cited

U.S. PATENT DOCUMENTS

| | | | |
|---|---|---|---|
| 7,067,395 B2* | 6/2006 | Maruyama et al. | 438/455 |
| 2007/0187677 A1* | 8/2007 | Park et al. | 257/40 |
| 2009/0195147 A1 | 8/2009 | Song et al. | |
| 2009/0206328 A1* | 8/2009 | Matsukawa et al. | 257/40 |
| 2010/0193778 A1* | 8/2010 | An et al. | 257/40 |
| 2011/0204353 A1* | 8/2011 | Yamazaki | 257/40 |
| 2011/0221334 A1* | 9/2011 | Kwon et al. | 313/504 |

FOREIGN PATENT DOCUMENTS

| | | |
|---|---|---|
| JP | 10074582 | 3/1998 |
| JP | 2005005166 A | 1/2005 |
| JP | 2005-209631 A | 8/2005 |
| JP | 2006-119270 | 5/2006 |
| JP | 2007035322 | 2/2007 |
| JP | 2007042467 | 2/2007 |
| JP | 2008-059867 A | 3/2008 |
| JP | 2009-070763 A | 4/2009 |
| JP | 2009-152085 A | 7/2009 |
| KR | 1020070051968 A | 5/2007 |
| KR | 1020070074828 A | 7/2007 |
| KR | 1020070120271 A | 12/2007 |
| KR | 1020080055243 A | 6/2008 |
| KR | 1020100081774 | 7/2010 |
| WO | 2008084743 A1 | 7/2008 |

\* cited by examiner

*Primary Examiner* — Dao H Nguyen
*Assistant Examiner* — Tram H Nguyen
(74) *Attorney, Agent, or Firm* — Robert E. Bushnell, Esq.

(57) ABSTRACT

An organic light emitting diode (OLED) display includes a display substrate including a display substrate including an organic light emitting element and a pixel defining layer having an opening defining a light emitting region of the organic light emitting element, an encapsulation substrate arranged opposite to the display substrate, a sealant arranged at an edge between the display substrate and the encapsulation substrate to seal a space between the display substrate and the encapsulation substrate from an outside and a filler filling the space between the display substrate and the encapsulation substrate, wherein the pixel defining layer has a thickness that varies by location, and a portion of the pixel defining layer closest to the sealant at edges of the display substrate having a thickness that is greater than a thickness of the pixel defining layer at all other portions of the display.

20 Claims, 8 Drawing Sheets

ORGANIC LIGHT EMITTING DIODE DISPLAY AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 10 Jul. 2009 and there duly assigned Serial No. 10-2009-0063230.

BACKGROUND OF THE INVENTION

1. Field of the Invention

An organic light emitting diode (OLED) display and a manufacturing method thereof that improves durability and suppresses generation of a defect.

2. Description of the Related Art

An organic light emitting diode (OLED) display has a self-emissive characteristic in that unlike the liquid crystal display, does not need a separate light source such as a backlight. Therefore, the OLED display can have a reduced thickness and weight. In addition, since the OLED display has high-quality characteristics such as low power consumption, high luminance, fast reaction, and the like, the OLED display is drawing attention as a next generation display device for a portable electronic device.

Generally, the OLED display includes a display substrate having an OLED, an encapsulation substrate that is arranged opposite to the display substrate to protect the OLED, and a sealant that adheres and seals the display substrate and the encapsulation substrate together. Since an empty space is arranged between the display substrate and the encapsulation substrate, there is a problem in that the mechanical strength of the OLED display can be compromised upon external impact.

In order to address this problem, the empty space between the display substrate and the encapsulation substrate can be filled with a filler via a vacuum bonding process to make the OLED display less vulnerable to damage upon external impact. However, when the space between the display substrate and the encapsulation substrate is filled with the filler, the filler contacts the sealant arranged along edges of the display and encapsulation substrates. When this contact occurs, the filler can interfere with the hardening or curing process of the sealant. As a result, there is a problem in that the sealant may not stably seal and bond the display substrate to the encapsulation substrate.

The above information disclosed in this Background section is only for enhancement of understanding of the background of the described technology and therefore it may contain information that is not prior art as per 35 U.S.C. §102.

SUMMARY OF THE INVENTION

The described technology has been made in an effort to provide an organic light emitting diode (OLED) display having advantages of reducing vulnerability of the display to damage while suppressing defects.

In addition, the present invention provides a method for manufacturing the OLED display.

According to one aspect of the present invention, there is provided an organic light emitting diode (OLED) that includes a display substrate including an organic light emitting element and a pixel defining layer having an opening defining a light emitting region of the organic light emitting element, an encapsulation substrate arranged opposite to the display substrate, a sealant arranged at an edge between the display substrate and the encapsulation substrate to seal a space between the display substrate and the encapsulation substrate from an outside and a filler filling the space between the display substrate and the encapsulation substrate, wherein the pixel defining layer has a thickness that varies by location, and a portion of the pixel defining layer closest to the sealant at edges of the display substrate having a thickness that is greater than a thickness of the pixel defining layer at all other portions of the display.

A drop point can be arranged at a location in the display where the pixel defining layer has a relatively small thickness, the thickness of the pixel defining layer varying in a stepwise fashion. The pixel defining layer can include a smallest thickness portion arranged about a drop point and a greatest thickness portion arranged at the edges of the display substrate, the thickness of the pixel defining layer gradually increasing from the smallest thickness portion to the greatest thickness portion. The pixel defining layer can have a cross-section of a step structure. The pixel defining layer can have a cross-section of a linear inclination structure. The OLED display can also include a plurality of spacers arranged on at least one of the display substrate and the encapsulation substrate to maintain an interval between the display substrate and the encapsulation substrate. Ones of the plurality of spacers can have lengths that vary according to location. The OLED display can include at least two separate drop points. The drop points can be arranged in a direction parallel to a long side of the display substrate.

According to another aspect of the present invention, there is provided a method of manufacturing an organic light emitting diode (OLED) display, including providing a display substrate and an encapsulation substrate, forming a pixel defining layer on the display substrate, the pixel defining layer having a thickness that varies at different locations, wherein a portion of the pixel defining layer having a relatively smaller thickness includes a drop point and an edge of the pixel defining layer has the greatest thickness, applying a sealant along edges of at least one of the display substrate and the encapsulation substrate, dripping a filler onto the drop point of the display substrate, allowing the filler to diffuse to edges of the display substrate; and sealing together the display substrate and the encapsulation substrate by combining together the display substrate and the encapsulation substrate.

The display substrate can further include an organic light emitting element, and the pixel defining layer can have an opening defining a light emitting region of the organic light emitting element. The pixel defining layer can include a smallest thickness portion arranged adjacent to and about the drop point and a greatest thickness portion arranged at the edges of the display substrate and the sealant can be arranged close to the greatest thickness portion of the pixel defining layer. The thickness of the pixel defining layer can gradually increase from the smallest thickness portion to the greatest thickness portion. The pixel defining layer can have a cross-section of a step structure. The pixel defining layer can have a cross-section of a linear inclination structure. The method can also include forming a plurality of spacers on at least one of the display substrate and the encapsulation substrate. Ones of the plurality of spacers can have lengths that vary according to location. The method can also include hardening the sealant while combining the display substrate and the encapsulation substrate together. The OLED display can include at least two separate drop points. Ones of the drop points can be arranged in a direction parallel to a long side of the display substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
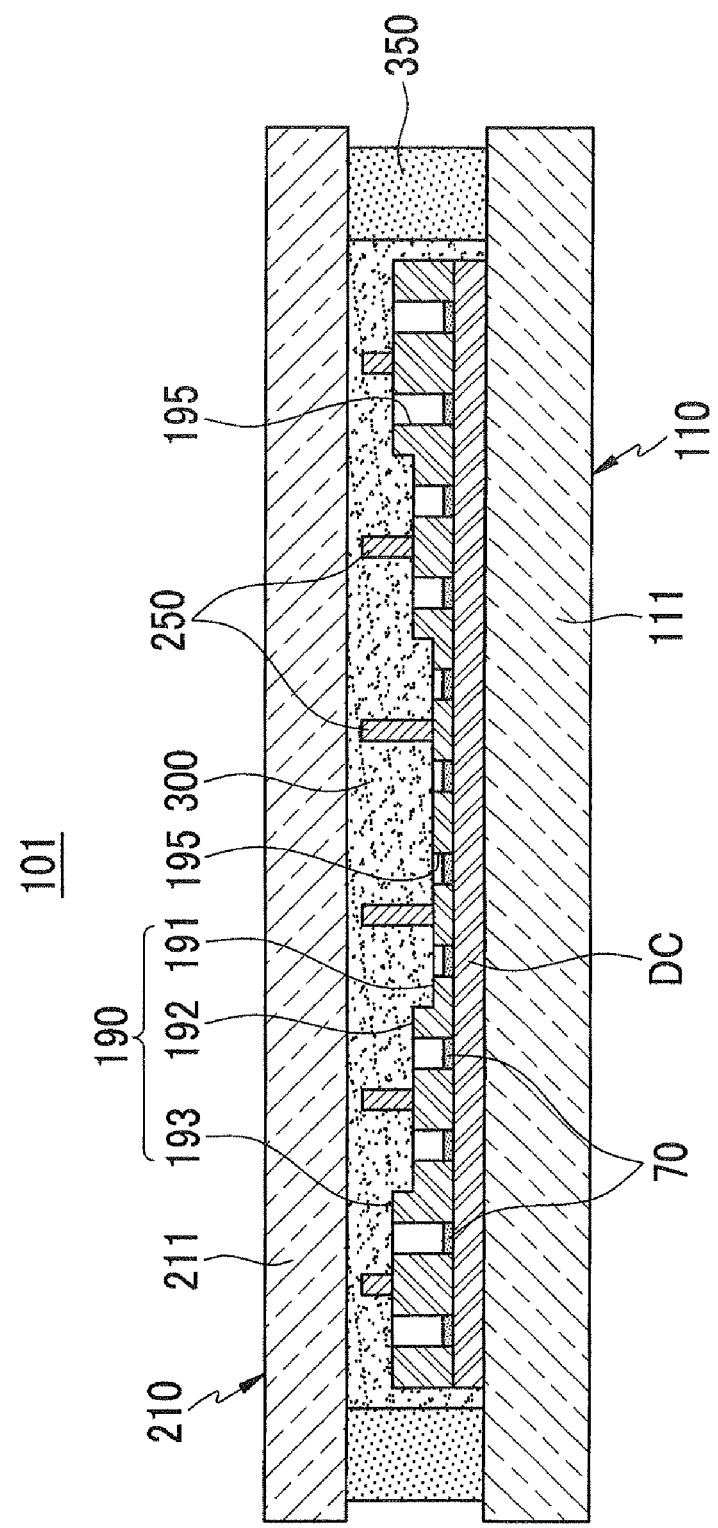
FIG. 1 is a cross-sectional view of an organic light emitting diode (OLED) display according to the first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, when describing a variety of exemplary embodiments, like reference numerals designate like elements that will be described in a first exemplary embodiment. Therefore, in other exemplary embodiments, only different elements will be described.

Accordingly, the drawings and description are to be regarded as illustrative in nature and not restrictive. Like reference numerals designate like elements throughout the specification.

In order to clarify layers and regions, thicknesses and sizes thereof are exemplarily illustrated and thus the present invention is not limited thereto.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present.

Further, although an active matrix type of OLED display of a 2Tr-1Cap structure in which one pixel has two thin film transistors and one capacitor is illustrated in the accompanying drawings, the present invention is not limited thereto. Therefore, the OLED display may be formed with pixels each having three or more thin film transistors and two or more capacitors. In addition, the OLED display may be formed in a variety of structures by adding additional metal lines. Here, the pixel is a minimum unit that can display an image, and the OLED display displays an image using a plurality of the pixels.

Next, the first exemplary embodiment will be described with reference to FIG. 1 to FIG. 3.

Figure 2:
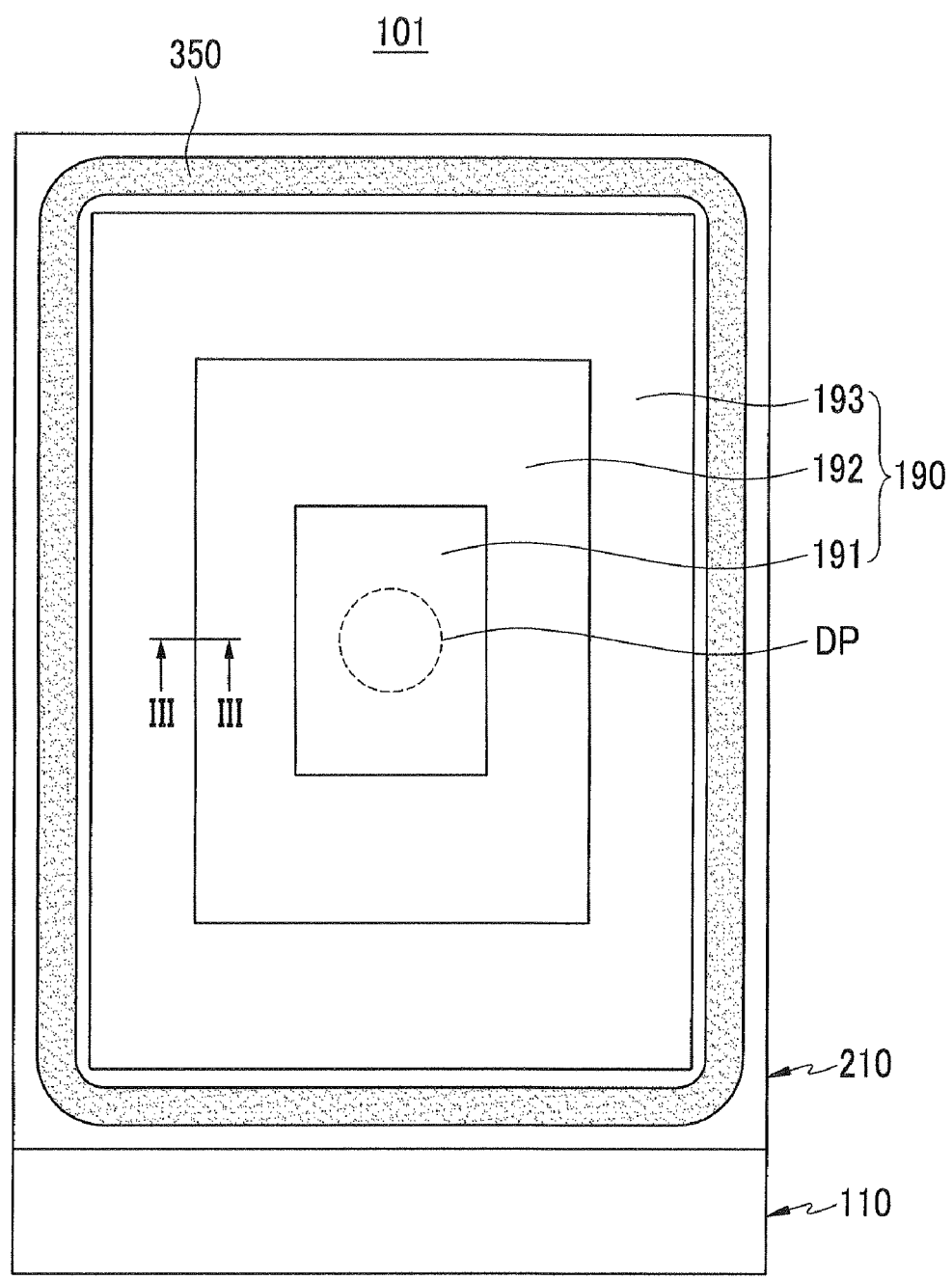
FIG. 2 is a top plan view of the organic light emitting diode (OLED) display of FIG. 1 focusing on the sealant and pixel definition layer.

As shown in FIG. 1, an organic light emitting diode (OLED) display 101 according to the first exemplary embodiment includes a display substrate 110, an encapsulation substrate 210, a sealant 350, and a filler 300. The display substrate 110 includes the first substrate main body 111, a driving circuit DC, an organic light emitting element 70 and a pixel defining layer 190 formed on the first substrate main body 111. The first substrate main body 111 may be made out of an insulating substrate such as glass, quartz, ceramic, or plastic, however the first exemplary embodiment is not limited thereto as the first substrate main body 111 can instead be made out of a metal substrate such as stainless steel.

Figure 5:
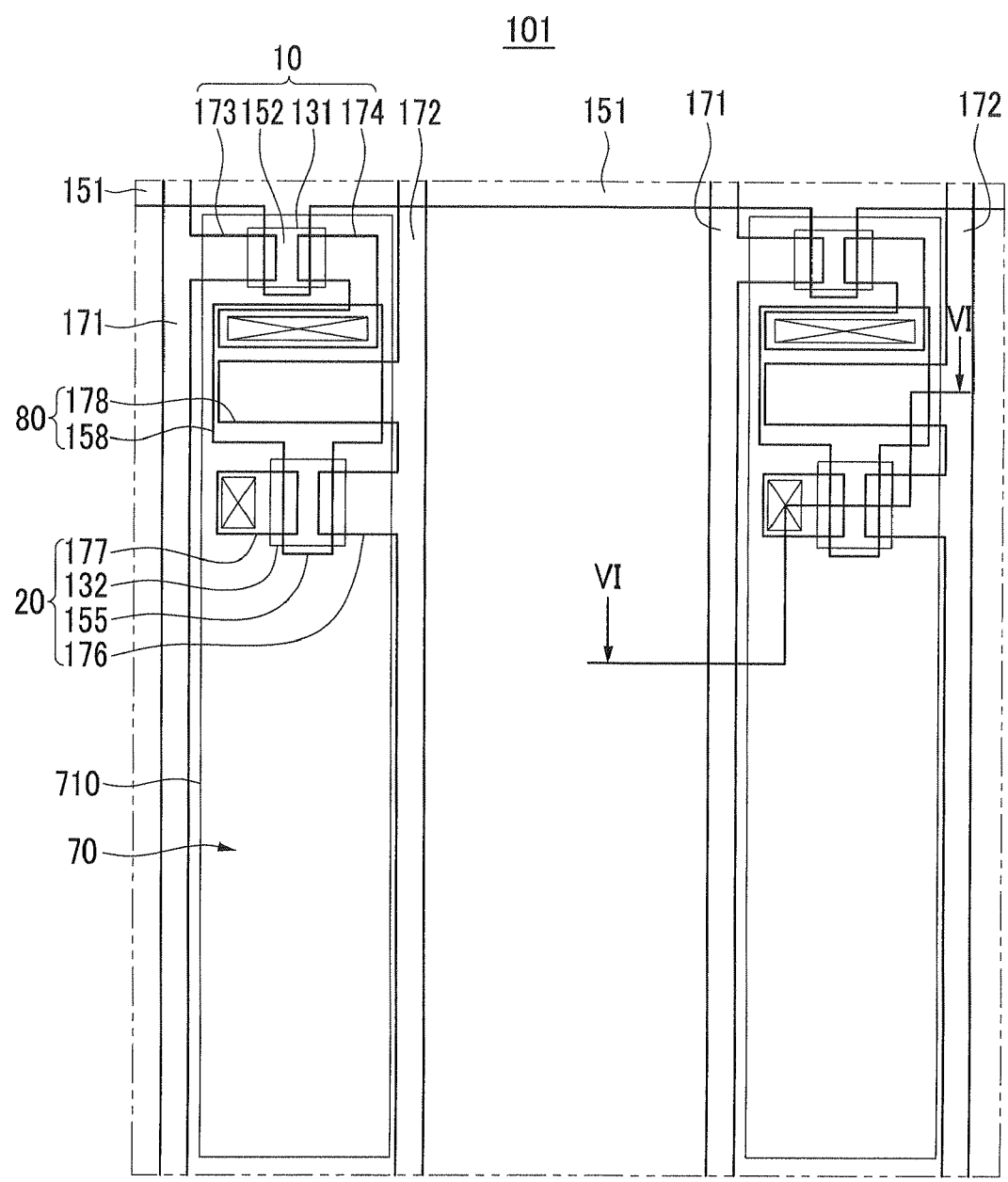
FIG. 5 is a layout view illustrating an enlarged internal structure of the organic light emitting diode (OLED) display of FIG. 1.

The driving circuit DC includes thin film transistors 10 and 20 (as shown in FIG. 5) to drive the organic light emitting element 70. The organic light emitting element 70 emits light and displays images according to driving signals transmitted from the driving circuit DC.

Figure 6:
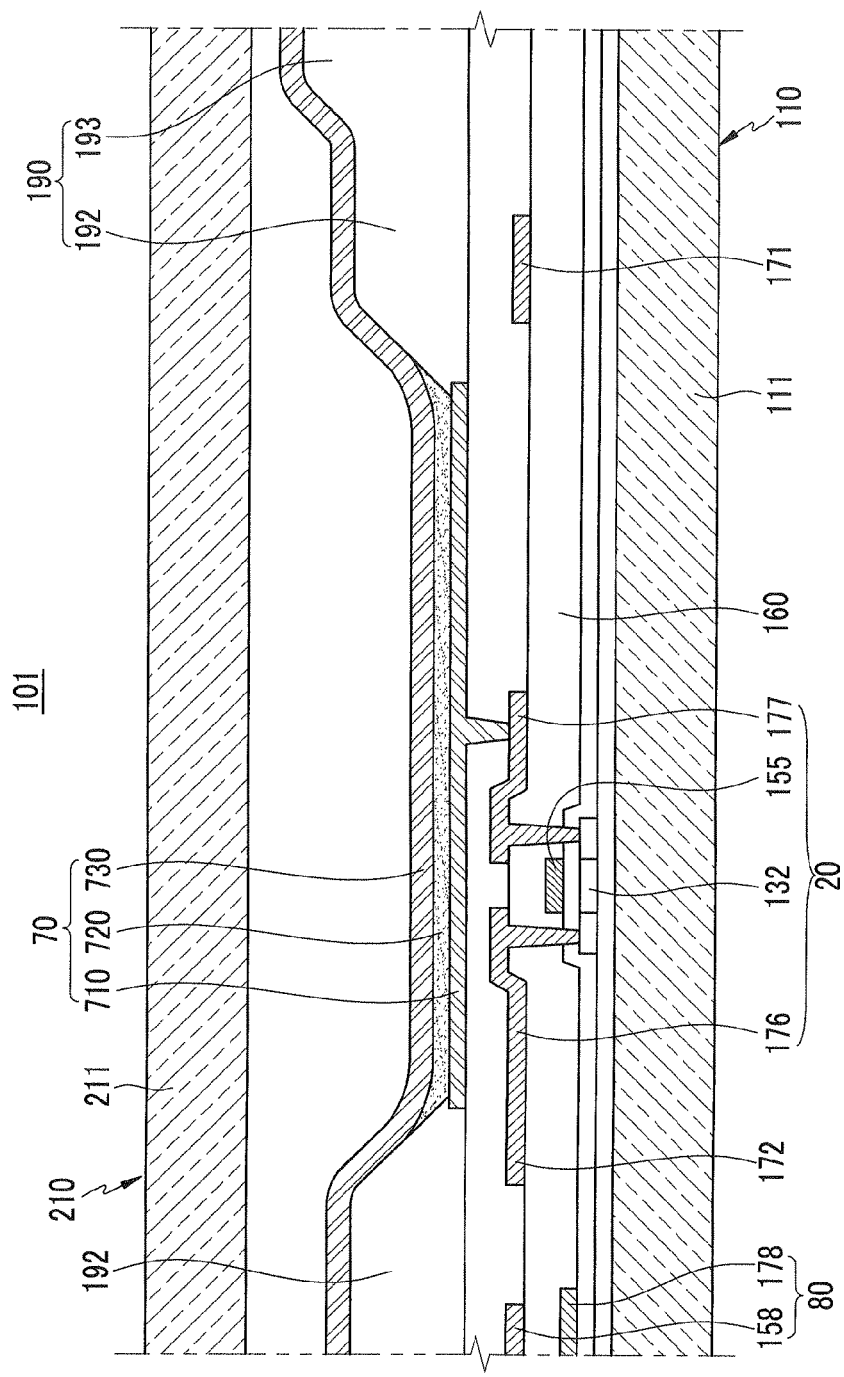
FIG. 6 is a cross-sectional view taken along the line VI-VI of FIG. 5.

The detailed structure of the organic light emitting element 70 and the driving circuit DC are shown in FIGS. 5 and 6, however the first exemplary embodiment is in no way limited to the structure shown in FIGS. 5 and 6 as the organic light emitting element 70 and the driving circuit DC may be variously modified within a range that can be easily realized by a person skilled in the art.

Figure 3:
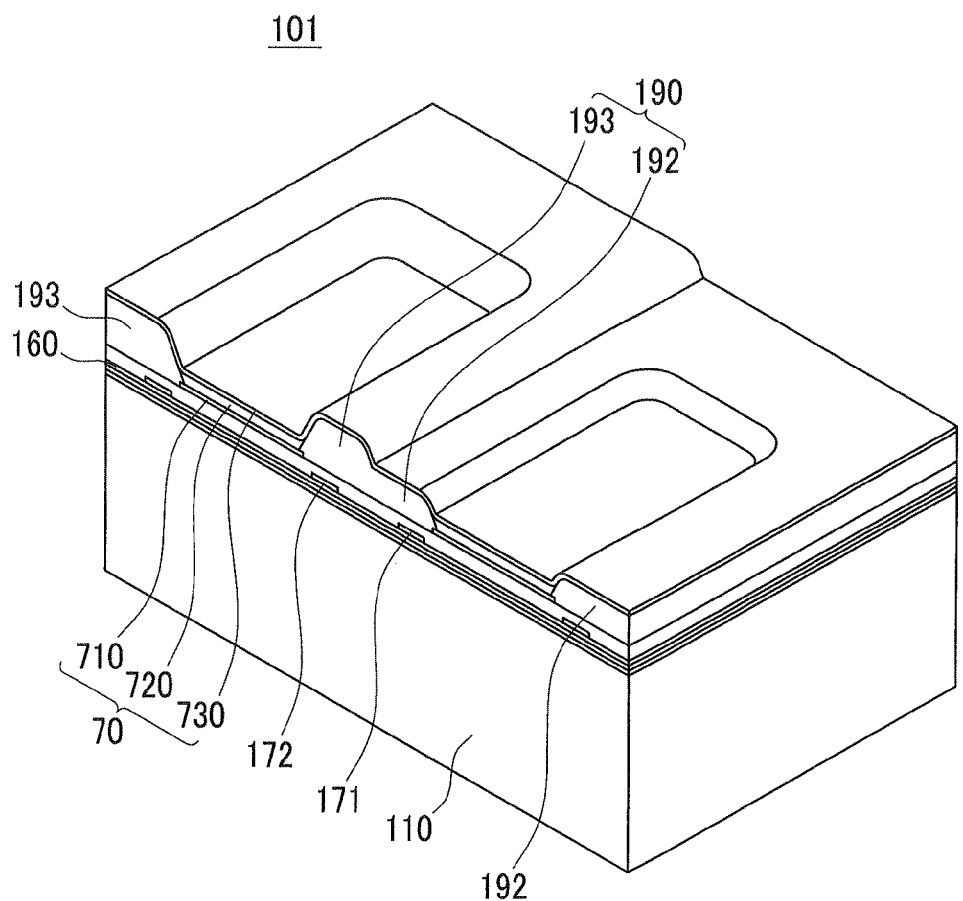
FIG. 3 is a partial perspective view taken along the line III-III of FIG. 2.

As shown in FIGS. 1 and 3, the pixel defining layer 190 has a plurality of openings 195 defining light emitting regions of organic light emitting elements 70. Also, the pixel defining layer 190 has a thickness that varies in steps. The portion of the pixel defining layer 190 having the greatest thickness is disposed at the edge of the display substrate 110, and the portion of the pixel defining layer 190 having the smallest thickness is disposed at the central part of the display substrate 110. Also, as shown in FIG. 2, a drop point DP is located at a portion of the pixel defining layer 190 having the smallest thickness. That is, the pixel defining layer 190 includes a smallest thickness portion 191 where the drop point DP is located, a greatest thickness portion 193 at the edges of the display substrate 110, and a middle thickness portion 192 having a middle thickness between the smallest thickness portion 191 and the greatest thickness portion 193. Here, the middle thickness portion 192 can have a thickness that varies in several steps. By designing the pixel defining layer 190 as such in the first exemplary embodiment, the thickness of the pixel defining layer 190 is gradually increased in steps from the smallest thickness portion 191 to the greatest thickness portion 193, and the cross-section thereof has a step structure. Also, in the first exemplary embodiment, the smallest thickness portion 191 of the pixel defining layer 190 is disposed at the central part of the display substrate 110, and accordingly the drop point DP is also disposed at the central part of the display substrate 110. Also, the pixel defining layer 190 can be made out of a polyacryl-based resin, a polyimide-based resin, or a silica-based inorganic material.

Again referring to FIG. 1 and FIG. 2, the encapsulation substrate 210 is arranged opposite to the display substrate 110, thereby covering the organic light emitting element 70 and the driving circuit DC of the display substrate 110. The encapsulation substrate 210 includes a second substrate main body 211 made out of a transparent material such as glass or plastic.

The sealant 350 is disposed along the edges of the display substrate 110 and the encapsulation substrate 210, thereby bonding the display substrate 110 to the encapsulation substrate 210. Here, the sealant 350 is disposed close to the greatest thickness portion 193 of the pixel defining layer 190.

The filler 300 is disposed between the display substrate 110 and the encapsulation substrate 210, thereby filling the space between the display substrate 110 and the encapsulation substrate 210. Also, the filler 300 may be made out of a resin material, a liquid crystal material, or various other known materials.

The filler 300 fills the empty space between the display substrate 110 and the encapsulation substrate 210 so that the mechanical strength of the organic light emitting diode (OLED) display 101 can be improved. That is, the filler 300 occupies the inner part of the organic light emitting diode (OLED) display 101 so that the OLED display 101 is less vulnerable to damage upon external impact.

The filler 300 is applied by dripping a filler material onto the drop point DP disposed in the smallest thickness portion 191 of the pixel defining layer 190. The filler material can then be diffused to the edges of the display substrate 110. The thickness of the pixel defining layer 190 is smallest at the location where the drop point DP is located, and is greatest at the edge of the display substrate 110 closest to the sealant 350. Accordingly, the diffusion and flow of the filler 300 from the drop point DP can be controlled by the contour of the pixel defining layer 190. That is, contour or profile of the pixel defining layer 190 suppresses excessively quick contact of the filler 300 with the sealant 350, allowing the sealant 350 to cure and harden without being influenced by the filler 300.

Also, the organic light emitting diode (OLED) display 101 may further include a plurality of spacers 250 formed on at least one of the display substrate 110 and the encapsulation substrate 210 to maintain an interval between the display substrate 110 and the encapsulation substrate 210. In the organic light emitting diode (OLED) display 101 according to the first embodiment of the present invention, the spacers 250 prevent the display substrate 110 and the encapsulation substrate 210 from contacting each other. Also, it is not necessary for the height of the spacers 250 to always be uniform across an entirety of the display substrate 110 and the encapsulation substrate 210.

The spacers 250 contact the display substrate 110 and the encapsulation substrate 210 to prevent the organic light emitting element 70 of the display substrate 110 from being damaged and to prevent deterioration from occurring.

Also, according to the location of the plurality of spacers 250, the spacers may have different lengths considering that the thickness of the pixel defining layer 190 varies with location. Here, the length of the spacers 250 means is the height of the spacers 250 taken in a direction perpendicular to the surface of the display substrate 110.

Also, the plurality of spacers 250, together with the pixel defining layer 190, can control the diffusion and the flow of the filler 300 from the drop point DP to other locations on the display. Here, the width, height, shape, and density of the spacers 250 can be appropriately designed to control the diffusion and the flow of the filler 300.

With the above-described configuration, the durability of the organic light emitting diode (OLED) display 101 upon external impact is improved and the generation of the sealing deterioration is suppressed.

Figure 4:
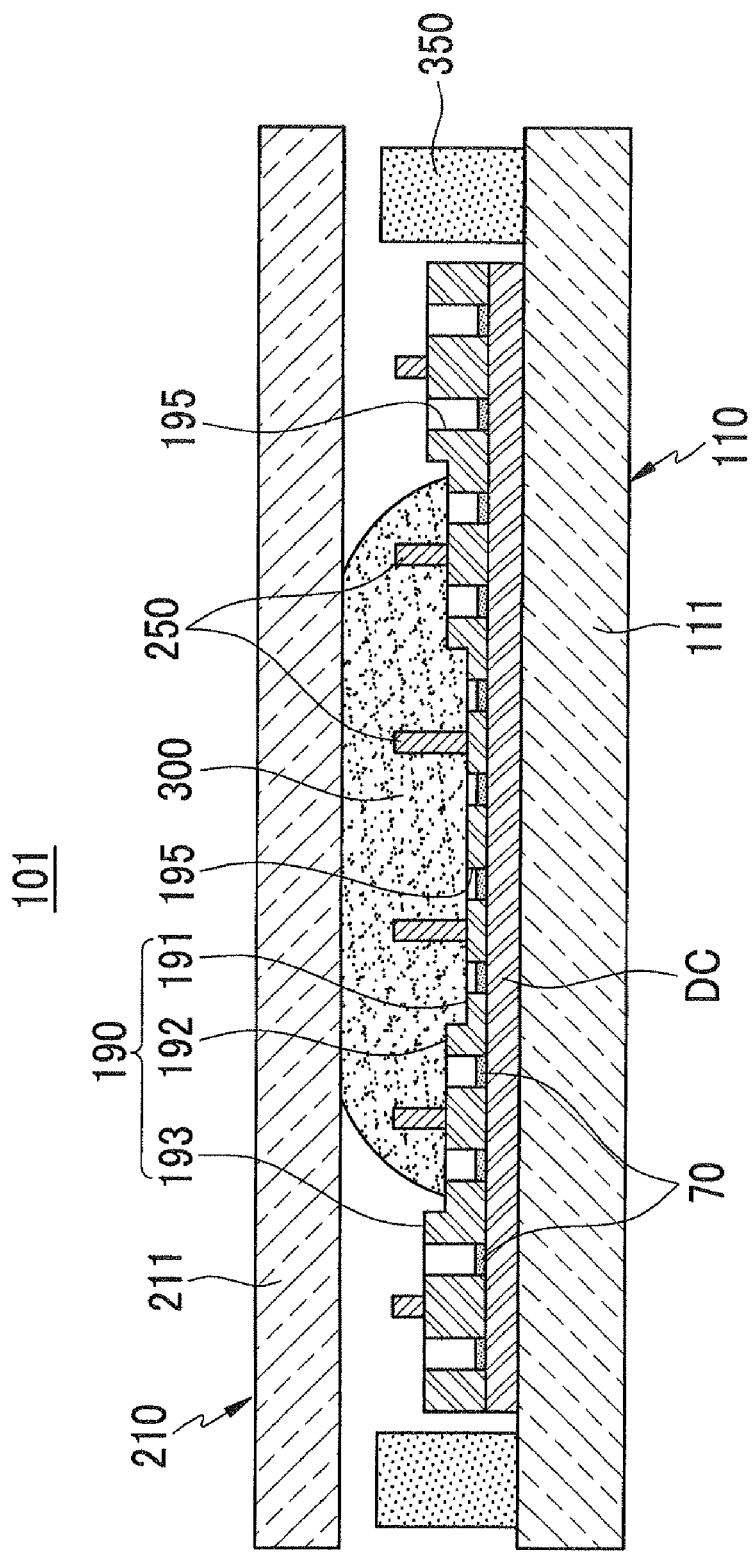
FIG. 4 is a cross-sectional view showing a portion of a manufacturing process of the organic light emitting diode (OLED) display of FIG. 1.

Next, a manufacturing method of an organic light emitting diode (OLED) display 101 according to the first exemplary embodiment will be described with reference to FIG. 2 to FIG. 4.

First, a display substrate 110 including a pixel defining layer 190 having several steps is formed. The pixel defining layer 190 has a smallest thickness portion where the drop point DP is located, and a greatest thickness portion disposed on the edge of the display substrate 110. That is, the pixel defining layer 190 includes a smallest thickness portion 191 where the drop point DP is located, a greatest thickness portion 193 disposed on the edge of the display substrate 110, and a middle thickness portion 192 having a middle height between the smallest thickness portion 191 and the greatest thickness portion 193. Also, in the first exemplary embodiment, the smallest thickness portion 191 of the pixel defining layer 190 and the drop point DP are disposed at the central part of the display substrate 110.

In this way, the thickness of the pixel defining layer 190 is gradually increased from the smallest thickness portion 191 where the drop point DP is disposed to the greatest thickness portion 193, and the cross-section of pixel defining layer 190 has steps.

Also, the display substrate 110 further includes an organic light emitting element 70, and the pixel defining layer 190 has a plurality of openings 195 defining the light emitting region of the organic light emitting element 70.

Next, a plurality of spacers 250 are formed on the pixel defining layer 190 of the display substrate 110. However, the first exemplary embodiment is not limited thereto, as the spacers 250 can instead be formed on an encapsulation substrate 210 that will be arranged opposite to the display substrate 110.

Also, the spacers 250 can be integrally formed with the pixel defining layer 190. That is, when forming the pixel defining layer 190 via a half-tone process, the pixel defining layer 190 and the spacers 250 may be formed together by controlling the exposure amount. Also, the pixel defining layer 190 and the spacers 250 can be made out of a polyacryl-based resin, a polyimide-based resin, or a silica-based inorganic material.

Next, a sealant 350 is applied to the edges of the display substrate 110 on the display substrate 110. Here, the sealant 350 is disposed close to the greatest thickness portion 193 of the pixel defining layer 190. Nevertheless, it is not always necessary for the sealant 350 to be formed on the display substrate 110. Accordingly, the sealant 350 can instead be applied to the encapsulation substrate 210. When the sealant 350 is applied to the encapsulation substrate 210 and when the display substrate 110 and the encapsulation substrate 210 are then combined, the sealant 350 is located close to the greatest thickness portion 193 of the pixel defining layer 190.

Next, a filler material is initially dripped onto the drop point DP disposed in the smallest thickness portion 191 of the pixel defining layer 190, and the filler material is then diffused towards the edges of the display substrate 110. Here, the pixel defining layer 190 having a thickness that varies in several steps controls the diffusion and the flow of the filler 300 initially dripped onto the drop point DP. That is, the pixel defining layer 190 serves to delay contact of the filler 300 with the sealant 350. As a result, the pixel defining layer 190 minimizes the damage to sealant 350 caused by rapid contact of the filler 300 with the sealant 350 during the curing of the sealant 350.

Next, the display substrate 110 and the encapsulation substrate 210 are combined via a vacuum combining method with the sealant 350 and the filler 300 interposed therebetween. Then, the sealant 350 is hardened, thereby completely sealing the space between the display substrate 110 and the encapsulation substrate 210 from an exterior of the display.

Through this manufacturing method, the durability of the organic light emitting diode (OLED) display 101 against impact is achieved and the generation of sealant deterioration is suppressed.

Next, an internal structure of an organic light emitting diode (OLED) display 101 will be described with reference to FIGS. 5 and 6. FIG. 5 a layout view showing a structure of a pixel focusing on a display substrate 110, and FIG. 6 is a cross-sectional view showing a display substrate 110 and an encapsulation substrate 210 taken along the line VI-VI of FIG. 5.

As shown in FIGS. 5 and 6, the display substrate 110 includes a switching thin film transistor 10, a driving thin film transistor 20, a capacitor 80, and an OLED 70 in each pixel. Here, the configuration including the switching thin film transistor 10, the driving thin film transistor 20, and the capacitor 80 is referred to as a driving circuit DC. Also, the display substrate 110 further includes gate lines 151 disposed according to one direction, data lines 171 intersecting and insulated from the gate lines 151, and a common power line 172. Here, one pixel may be defined by the gate line 151, the data line 171, and the common power line 172, but the present invention is not limited thereto.

The organic light emitting element 70 includes a pixel electrode 710, an organic emission layer 720 formed on the pixel electrode 710, and a common electrode 730 formed on the organic emission layer 720. Here, the pixel electrode 710 is a positive (+) electrode or anode and is a hole injection electrode, and the common electrode 730 is a negative (−) electrode or cathode and is an electron injection electrode. However, the present invention is not necessarily limited thereto, and depending upon the driving method of the organic light emitting diode display 101, the pixel electrode 710 may be a cathode and the common electrode 730 may be an anode. Holes and electrons are injected from the pixel electrode 710 and the common electrode 730 respectively into the organic emissive layer 720. When excitons, being combinations of the injected holes and electrons, shift from an excited state to a ground state, light is emitted.

Furthermore, in an organic light emitting diode display according to the first exemplary embodiment, the organic light emitting diode 70 emits light in the direction of the encapsulation substrate 210. That is, the organic light emitting diode display 101 is a front emission type. Here, for the organic light emitting element 70 to emit light in the direction of the encapsulation substrate 210, the pixel electrode 710 is a reflective electrode and the common electrode 730 is a transparent or translucent electrode. However, in the first exemplary embodiment, the organic light emitting diode (OLED) display 101 is not limited to the front light emitting type. Accordingly, the organic light emitting diode (OLED) display 101 can instead be a rear light emitting type or a dual side light emitting type.

The capacitor 80 has a pair of capacitor electrode plates 158 and 178, and an interlayer insulating layer 160 interposed between the two capacitor electrode plates 158 and 178. The interlayer insulating layer 160 functions as a dielectric. The capacitance is determined depending upon electric charges charged at the capacitor 80 and the voltages applied to the two capacitor electrode plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting the pixels to emit light. The switching gate electrode 152 is connected to the gate line 151, the switching source electrode 173 is connected to the data line 171 and the switching drain electrode 174 is connected to one capacitor electrode plate 158 while being separated from the switching source electrode 173.

The driving thin film transistor 20 applies a driving voltage to the pixel electrode 710 to excite the organic emissive layer 720 of the first organic light emitting diode 70 in the selected pixel. The driving gate electrode 155 is connected to the capacitor electrode plate 158 that is connected to the switching drain electrode 174. The driving source electrode 176 and the other capacitor electrode plate 178 are each connected to the common power line 172. The driving drain electrode 177 is connected to the pixel electrode 710 of the organic light emitting diode 70 through a contact hole.

With the above structure, the switching thin film transistor 10 is operated by the gate voltage applied to the gate line 151, and transmits the data voltage applied to the data line 171 to the driving thin film transistor 20. A voltage corresponding to a difference between the common voltage applied to the driving thin film transistor 20 from the common power line 172 and the data voltage transmitted from the switching thin film transistor 10 is stored in the capacitor 80, and a current corresponding to the voltage stored at the capacitor 80 flows to the organic light emitting diode 70 through the driving thin film transistor 20 to thereby excite the organic light emitting diode 70. Also, the encapsulation substrate 210, for protecting the organic light emitting element 70, is disposed on the organic light emitting element 70, as shown in FIG. 6.

Figure 7:
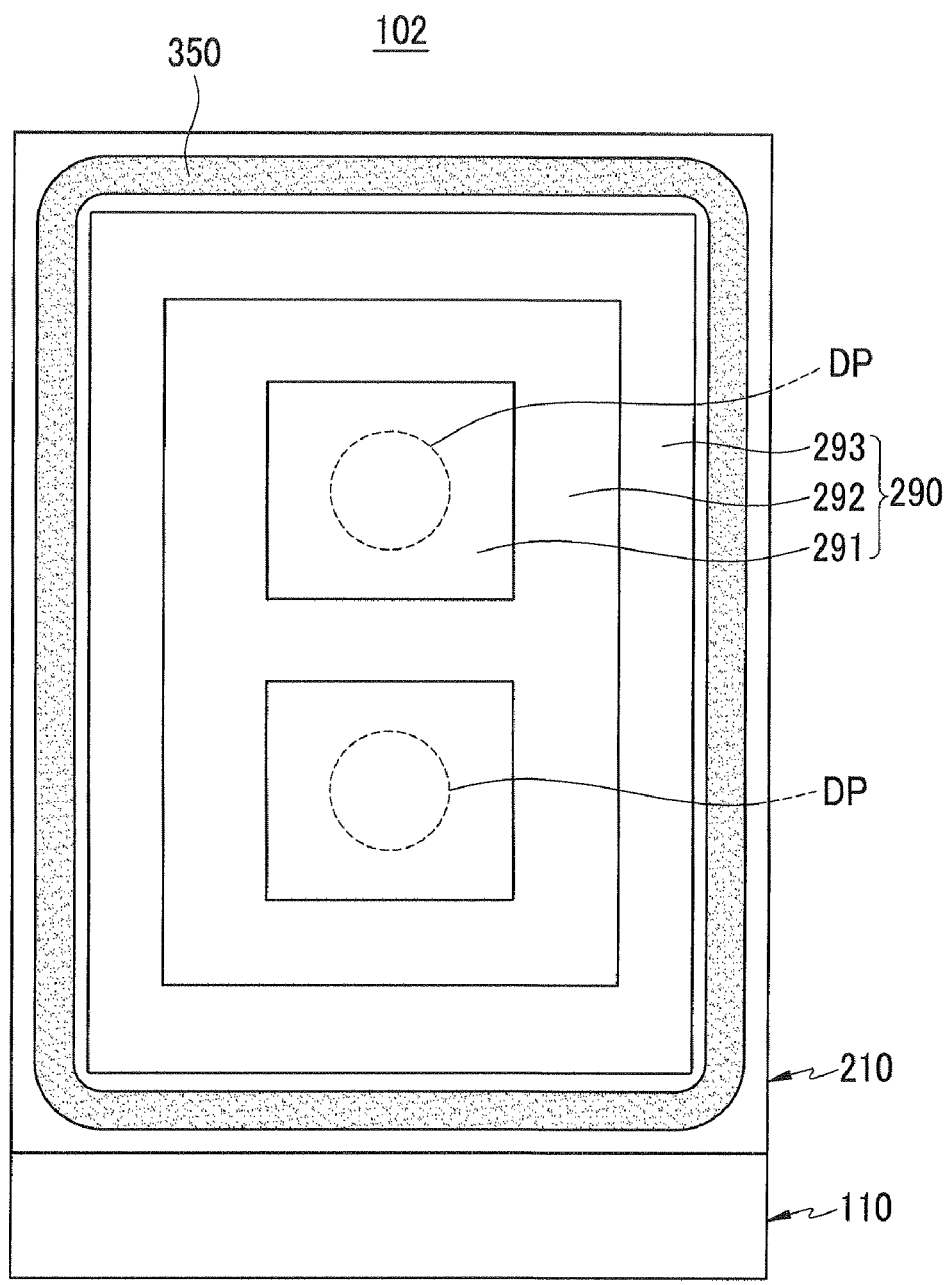
FIG. 7 is a top plan view of an organic light emitting diode (OLED) display according to the second exemplary embodiment of the present invention.

Next, the second exemplary embodiment of the present invention will be described with reference to FIG. 7. As shown in FIG. 7, an organic light emitting diode (OLED) display 102 according to the second exemplary embodiment has two or more drop points DP. Also, a smallest thickness portion 291 of a pixel defining layer 290 including the two or more drop points DP may be formed. A greatest thickness portion 293 of the pixel defining layer 290 is disposed close to the sealant 350 at the edges of the display substrate 110. Instead of varying the thickness of the pixel defining layer 290 in steps as in the first embodiment, the thickness of the pixel defining layer 290 of the second embodiment is instead gradually increased from the smallest thickness portion 291 through a middle thickness portion 292 and to the greatest thickness portion 293.

The display substrate 110 has a rectangular shape and has a pair of long sides and a pair of short sides. The drop points DP are arranged in the direction parallel to the long sides of the display substrate 110.

When the drop point DP is disposed on one central position of the display substrate 110 of the rectangular shape as in the first embodiment, the required times it takes for the filler 300 to diffuse from the drop point DP to the long edge and the short edge of the display substrate 110 are different from each other. That is, the filler 300 reaches the sealant 350 formed along the long edge of the display substrate 110 before the filler 300 reaches the sealant 350 formed along the short edge. Accordingly, the influence of the filler 300 upon the curing of the sealant 350 becomes non-uniform so that deterioration of the sealant in the organic light emitting diode (OLED) display 101 may occur.

However, in the second exemplary embodiment, the organic light emitting diode (OLED) display 102 has two or more drop points DP, and the drop points DP are arranged in the direction parallel to the long edge of the display substrate 110 so that the difference in time it takes for the filler 300 to diffuse to and reach different portions of the sealant 350 is reduced with the design of the second embodiment of the present invention.

With the above-described configuration, the durability of the organic light emitting diode (OLED) display 102 against impact is improved and the occurrence of sealing deterioration is suppressed.

Also, a manufacturing method of the organic light emitting diode (OLED) display 102 according to the second exemplary embodiment is the same as the manufacturing method of the organic light emitting diode (OLED) display 101 according to the first exemplary embodiment except for the fact that the filler 300 is dripped into two or more drop points DP instead of one and that the diffusion of the filler emanates from two or more drop points DP instead of one.

Figure 8:
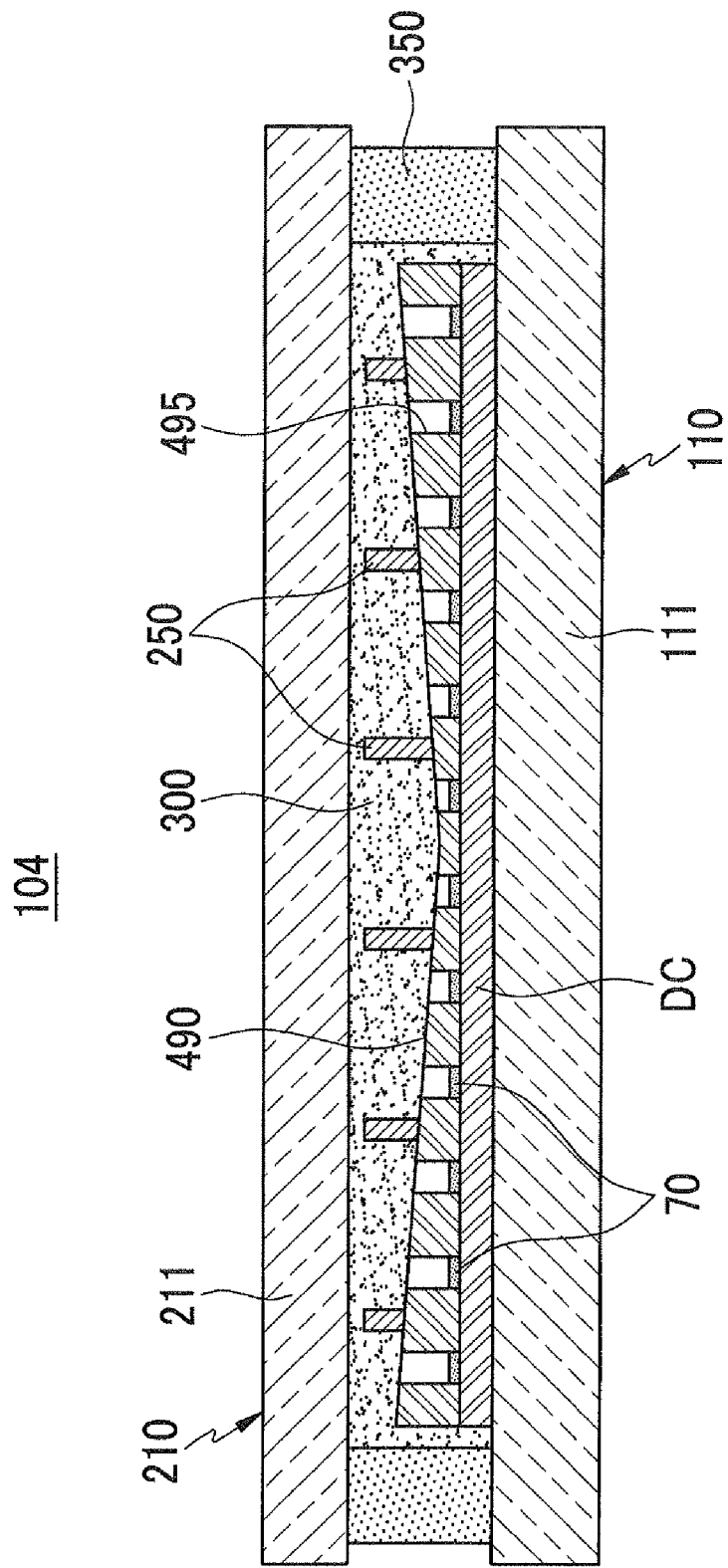
FIG. 8 is a cross-sectional view of an organic light emitting diode (OLED) display according to the third exemplary embodiment of the present invention.

Next, the third exemplary embodiment of the present invention will be described with reference to FIG. 8. As shown in FIG. 8, an organic light emitting diode (OLED) display 104 according to the third exemplary embodiment includes a pixel defining layer 490 having a cross-section having a gradual inclination. That is, the thickness of the pixel defining layer 490 is gradually and linearly increased from the portion where the drop point is located to the edge of the display substrate 110. In FIG. 8, the element number 495 indicates an opening in the pixel defining layer 490 defining light emitting regions of organic light emitting elements 70.

With the above-described configuration, when the filler 300 is dripped into the drop point disposed on the smallest thickness portion of the pixel defining layer 490 and is diffused to the edges of the display substrate 110, the pixel defining layer 490 prevents the filler from quickly diffusing to the sealant 350 so that the filler 300 does not interfere with the curing process of the sealant 350.

Also, the manufacturing method of the organic light emitting diode (OLED) display 104 according to the third exemplary embodiment is the same as the manufacturing method of the organic light emitting diode (OLED) display 101 according to the first exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
   a display substrate including an organic light emitting element and a pixel defining layer having an opening defining a light emitting region of the organic light emitting element;
   an encapsulation substrate arranged opposite to the display substrate;
   a sealant arranged at an edge between the display substrate and the encapsulation substrate to seal a space between the display substrate and the encapsulation substrate from an outside; and
   a filler filling the space between the display substrate and the encapsulation substrate,
   the pixel defining layer having a thickness that varies by location, and a portion of the pixel defining layer closest to the sealant at edges of the display substrate having a thickness that is greater than a thickness of the pixel defining layer at all other portions of the display.

2. The organic light emitting diode (OLED) display of claim 1, further comprised of the thickness of the pixel defining layer varying in a stepwise fashion and a drop point arranged at a location in the display where the pixel defining layer has a relatively smaller thickness.

3. The organic light emitting diode (OLED) display of claim 1, wherein the pixel defining layer includes a smallest thickness portion arranged about a drop point and a greatest thickness portion arranged at the edges of the display substrate, the thickness of the pixel defining layer gradually increasing from the smallest thickness portion to the greatest thickness portion.

4. The organic light emitting diode (OLED) display of claim 2, wherein the pixel defining layer has a cross-section of a step structure.

5. The organic light emitting diode (OLED) display of claim 3, wherein the pixel defining layer has a cross-section of a linear inclination structure.

6. The organic light emitting diode (OLED) display of claim 3, further comprising a plurality of spacers arranged on at least one of the display substrate and the encapsulation substrate to maintain an interval between the display substrate and the encapsulation substrate.

7. The organic light emitting diode (OLED) display of claim 6, wherein ones of the plurality of spacers have lengths that vary according to location.

8. The light emitting diode (OLED) display of claim 2, the OLED display comprising at least two separate drop points.

9. The organic light emitting diode (OLED) display of claim 8, wherein the drop points are arranged in a direction parallel to a long side of the display substrate.

10. A method of manufacturing an organic light emitting diode (OLED) display, comprising:
    providing a display substrate and an encapsulation substrate;
    forming a pixel defining layer on the display substrate, the pixel defining layer having a thickness that varies at different locations, wherein a portion of the pixel defining layer having a relatively smaller thickness includes a drop point and an edge of the pixel defining layer has the greatest thickness;
    applying a sealant along edges of at least one of the display substrate and the encapsulation substrate;
    dripping a filler onto the drop point of the display substrate;
    allowing the filler to diffuse to edges of the display substrate; and
    sealing together the display substrate and the encapsulation substrate by combining together the display substrate and the encapsulation substrate.

11. The method of claim 10, wherein
    the display substrate further comprises an organic light emitting element, and
    the pixel defining layer has an opening defining a light emitting region of the organic light emitting element.

12. The method of claim 10, wherein
    the pixel defining layer includes a smallest thickness portion arranged adjacent to and about the drop point and a greatest thickness portion arranged at the edges of the display substrate, and
    the sealant being arranged close to the greatest thickness portion of the pixel defining layer.

13. The method of claim 12, wherein the thickness of the pixel defining layer is gradually increased from the smallest thickness portion to the greatest thickness portion.

14. The method of claim 13, wherein the pixel defining layer has a cross-section of a step structure.

15. The method of claim 13, wherein the pixel defining layer has a cross-section of a linear inclination structure.

16. The method of claim 10, further comprising forming a plurality of spacers on at least one of the display substrate and the encapsulation substrate.

17. The method of claim 16, wherein ones of the plurality of spacers have lengths that vary according to location.

18. The method of claim 10, further comprising hardening the sealant while combining the display substrate and the encapsulation substrate together.

19. The method of claim 11, wherein the OLED display comprises at least two separate drop points.

20. The method of claim 19, wherein ones of the drop points are arranged in a direction parallel to a long side of the display substrate.

* * * * *